(12) United States Patent  (10) Patent No.: US 7,390,747 B2
Irikura et al.                (45) Date of Patent:     Jun. 24, 2008

(54) NITRIDE SEMICONDUCTOR SUBSTRATE AND METHOD OF PRODUCING SAME

(75) Inventors: Masato Irikura, Hyogo (JP); Yasushi Mochida, Hyogo (JP); Masahiro Nakayama, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 287 days.

(21) Appl. No.: 11/262,823

(22) Filed: Nov. 1, 2005

(65) Prior Publication Data

US 2006/0071234 A1    Apr. 6, 2006

Related U.S. Application Data

(62) Division of application No. 10/954,186, filed on Oct. 1, 2004, now Pat. No. 7,154,131.

(30) Foreign Application Priority Data

Oct. 3, 2003  (JP) .............................. 2003-345910

(51) Int. Cl.
H01L 21/302 (2006.01)
H01L 21/461 (2006.01)

(52) U.S. Cl. ...................... 438/690; 438/691; 438/692

(58) Field of Classification Search .......... 438/690–692
See application file for complete search history.

(56) References Cited

U.S. PATENT DOCUMENTS 6,468,347 B1  10/2002 Motoki et al.
6,596,079 B1   7/2003 Vaudo et al.
6,875,082 B2*  4/2005 Nakayama et al. ........... 451/36

FOREIGN PATENT DOCUMENTS

| JP | 10-256662   | 9/1998  |
| JP | 10-316498   | 12/1998 |
| JP | 2000-012900 | 1/2000  |
| JP | 2001-102307 | 4/2001  |
| JP | 2001-322899 | 11/2001 |

OTHER PUBLICATIONS

P.R. Tavernier et al. "Chemical Mechanical Polishing of Gallium Nitride", Electrochemical and Solid-State Letters, 2002. G61-G64. 5 (8).
Ishida, M., et al. "Drastic reduction of threading dislocation in GaN regrown on grooved stripe structure." Journal of Crystal Growth, vol. 221, (2000), pp. 345-349.
Xueping Xu, etal., "Fabrication of GaN wafers for electronic and optoelectronic devices," Optical Materials 23 (2003), pp. 1-5.

* cited by examiner

*Primary Examiner*—Thien F Tran
(74) *Attorney, Agent, or Firm*—McDermott Will & Emery LLP

(57) ABSTRACT

A nitride semiconductor substrate having a rugged surface being lapped by whetting granules to roughness between Rms5 nm and Rms200 nm, which has a function of reducing dislocations of a GaN, InGaN or AlGaN layer epitaxially grown on the lapped substrate by gathering dislocations in the epi-layer to boundaries of holes, pulling the dislocations to bottoms of the holes. Higher roughness of the nitride substrate degrades morphology of an epitaxially-grown layer thereon but reduces dislocation density to a lower level. Morphology of the epi-layer contradicts the dislocation density of the epi-layer. The nitride semiconductor substrate can reduce dislocation density and can be low cost and useful substrates.

2 Claims, 7 Drawing Sheets

NITRIDE SEMICONDUCTOR SUBSTRATE AND METHOD OF PRODUCING SAME

RELATED APPLICATIONS

This application is a divisional of application Ser. No. 10/954,186, filed Oct. 1, 2004, now U.S. Pat. No. 7,154,131 which claims priority of Japanese Application No. 2003-345910, filed Oct. 3, 2003, the contents of which are hereby incorporated by reference.

BACKGROUND OF THE INVENTION

1. Field of the Invention

This invention relates to nitride semiconductor substrates and a method of producing a nitride semiconductor substrates. InGaN-type blue light emitting devices (LEDs+LDs) are produced by piling n-type or p-type GaN (gallium nitride), InGaN (indiumgallium nitride), AlGaN (aluminum-gallium nitride) films on sapphire ($Al_2O_3$) substrates or silicon carbide (SiC) substrates in vapor phase. Almost all of the blue light emitting diodes (LEDs) and blue light laser diodes (LDs) are made on sapphire substrates at present. Sapphire substrates have advantages of an established production method, a stable supply, low cost, affluent accomplishment, long lifetimes and high reliability.

This application claims the priority of Japanese Patent Application No. 2003-345910 filed on Oct. 3, 2003, which is incorporated herein by reference.

Sapphire has a lattice constant different from the lattice constant of GaN or InGaN. GaN or InGaN films grown on sapphire have high density of dislocations. Despite the difference of lattice constants, sapphire enables device makers to produce light emitting diodes (LEDs) which produces light of a wide range of wavelengths from blue to green. GaN blue light emitting diodes on the sapphire substrate are utilized widely. InGaN/sapphire LED are enough for cheap LEDs of a wide range of wavelengths.

Sapphire substrates have a variety of drawbacks, e.g., non-cleavage, insulation and lattice-misfit. Lack of cleavage prevents makers from producing neat resonator mirrors of on-sapphire laser diodes (LDs) by natural cleavage. The resonator mirrors should be made to be flat by mechanical dicing and polishing, which raises cost and lowers yield.

Sapphire is an insulator. Insulation prevents an on-sapphire device from having an n-electrode on the bottom. Instead of the bottom, an n-electrode is formed on an n-type thick GaN film by piling the thick GaN film on the sapphire substrate, growing other n- or p-GaN, InGaN layers, etching a part of the piled layers from the top till the thick n-GaN film. The top n-electrode is a drawback of the on-sapphire LEDs. Top n-electrode and p-electrode are wirebonded to a n-leadpin and a p-leadpin respectively. The top n-electrode doubles the times of wirebonding. The top n-electrode induces another inconvenience. The top n-electrode on the thick n-GaN film requires an extra area in an LED, which decreases the ratio of emission area to the whole LED area. These are drawbacks caused by insulator sapphire.

Another drawback is the lattice misfit between sapphire and film nitride (GaN, InGaN, AlGaN). GaN, InGaN or other nitride films grown on sapphire substrates include dislocations of high density from $10^9$ cm$^{-2}$ to $10^{10}$ cm$^{-2}$. High dislocation density matters little in the case of LEDs which emit low power light with low driving current density. In future, high power LEDs will be required. The high dislocation density may be an obstacle in future high power LEDs which are made upon sapphire substrates.

GaN substrates are desired for making LEDs or LDs instead of sapphire substrates. If a GaN substrate were used, good GaN, InGaN films would be grown on the GaN substrate for the sake of lattice-fitting. An n-type GaN is not insulating but conductive. An n-electrode could be formed on the bottom of an n-GaN substrate. The n-electrode would come into contact with a cathode pin only by die-bonding an LED chip on the cathode pin. The difficulty of the top n-electrode would be solved. Elimination of top n-electrode could widen an effective area. Use of the facet-growth method, which is described later, will reduce dislocation density down to $10^7$ cm$^{-2}$ to $10^8$ cm$^{-2}$. An epitaxial GaN wafers can be easily and exactly divided into individual chips by natural cleavage.

However it is difficult to make a large GaN single crystal. When solid GaN is heated, solid GaN is not melted but sublimes into vapor GaN. Liquid phase crystal growth (Czochralski, Bridgman) is forbidden. Then vapor phase epitaxy, which was inherently a method of making thin films of GaN, is diverted to making thick GaN substrate. The vapor phase method prepares an undersubstrate, piling a GaN film on the undersubstrate for long hours, eliminates the undersubstrate and obtains a freestanding GaN substrate.

Assuming that a GaN freestanding substrate was obtained, a good low-dislocation density GaN film could be epitaxially grown on the GaN substrate due to lattice-fitting. But the fact is otherwise. High density of dislocations accompany GaN films grown on the GaN substrate in fact. Why the epi-films are plagued with high density of dislocations? The GaN substrate has inherent high density of dislocations. The dislocations survive also in the epi-films. The epi-films transcribe all the dislocations on the GaN substrate. Dislocations are transferred from the substrate to the films. Since the GaN substrate has high density of dislocations, the epi-layers have also high density of dislocations. The use of a GaN substrate cannot reduce dislocations on epi-layers grown thereon. The inventors have been aware of the facts.

2. Description of Related Art

When GaN films are grown directly upon a sapphire substrate with maintaining a C-plane surface, the grown GaN are plagued at plenty of dislocations. The inventors of the present invention have contrived a novel (face growth method) method for reducing dislocations in films by making facet pits on the growing GaN surface, maintaining the facets forming the pits, growing the GaN film with dislocations, sweeping the dislocations into bottoms of the facet pits, producing dislocation bundles at the bottoms of the pits and decreasing dislocations in other regions. Japanese Patent Laying Open No. 2001-102307 proposed the face growth method. The proposed method enables the inventors to make low dislocation density GaN freestanding substrate of low dislocation density of $10^7$ cm$^{-2}$ to $10^8$ cm$^{-2}$ by counting a bundle of dislocations as a single dislocation. However dislocations are not annihilated in the new method. Since many dislocations are gathered and unified into a bundle, the number of dislocations seems to decrease. However, the apparent decline of dislocations is meaningful and the facet-grown GaN substrates are useful, because good devices can be fabricated upon lower dislocation density parts.

The freestanding crystal of GaN is not all the necessary conditions of a wafer for making devices thereupon. Patterns are formed on semiconductor wafers by photolithography. Flatness or immunity of distortion is necessary. Furthermore, the surfaces should be extra smooth, mirror-surfaces. Here stepping aside the distortion, the outstanding problem is the smoothness of surfaces of GaN wafers. The smoothness cannot be expressed directly. Smoothness is an antinomy of ruggedness. The ruggedness can be represented by surface roughness.

Superficial smoothness is a problem different from the problem of dislocations. Polishing would raise smoothness of substrates. Repetitions of polishing would further enhance the smoothness of the substrates. However repetitions of polishing raises cost of substrate wafers. The scope of the desirable smoothness should be determined by reconciling the device-desired properties with the cost.

No GaN substrate of a practical scale had existed till recently. Few documents referred to surface roughness of GaN substrates. Japanese Patent Laying Open No. 10-256662, "Method of producing nitride semiconductor substrates and method of producing nitride semiconductor devices", says that height differences on surfaces of GaN substrates should be less than ±1 μm. An n-GaN layer, n-AlGaN/GaN superlattice cladding layers, an InGaN active layer, p-AlGaN/GaN superlattice cladding layers, a p-GaN capping layer would be grown in turn on a substrate. The first n-GaN layer has an about 5 μm thickness. Other layers are all very thin. The n-AlGaN layers in the superlattice are 0.02 μm thick. The GaN layers in the same superlattice are 0.02 μm thick. The InGaN active layer is 0.03 μm thick. If the substrate had surface roughness over ±1 μm, excess height differences would appear on the upper AlGaN, GaN and InGaN layers epitaxially grown on the over ±1 μm rugged substrates and the excess height differences would degrade the properties of blue light emitting diodes. Then Japanese Patent Laying Open No. 10-256662 insisted upon under ±1 μm roughness of GaN substrates.

The 5 μm n-GaN layer would have alleviated the bad influence of the rugged substrates. Thus the lowest limit of height differences should be ±0.3 μm in Japanese Patent Laying Open No. 10-256662.

Irrespective of the dislocation density, Japanese Patent laying Open No. 10-256662 proposed a preferable scope of roughness from ±1 μm to ±0.3 μm for the sake of preventing the films grown on the substrates from being torn out. Since the scope of preferable roughness is represented with a symbol ±, the scope should be doubled. The desired hill/valley differences should be 2 μm to 0.6 μm in Japanese Patent laying Open No. 10-256662. The hill/valley differences should be identical to be an average of differences between neighboring hills and valleys. Thus the hill/valley differences correspond to twice of Ra (=2 Ra). Then the hill/valley differences of ±1 μm to ±0.3 μm would be equal to Ra2 μm to Ra0.6 μm.

Ra and Rms are both roughness parameters. Values of Ra and Rms depend upon morphology of object surfaces. The relation between Ra and Rms is not simple. The rate of Ra to Rms is not constant. Without exception, Ra is smaller than Rms. When the surface disturbance is regular and the rate Rms/Ra is smallest, the Rms/Ra rate is about Rms/Ra=1.3. In the cases of irregular roughness, the rate Rms/Ra takes values of 1.3 to 2. In an average case, the rate Rms/Ra may be 1.5. Then Ra=0.3 μm to 1 μm of Japanese Patent Laying Open No. 10-256662 should correspond to Rms=3 μm to 1 μm.

Japanese Patent Laying Open No. 10-256662 asserted that the surface of the GaN substrates should be smaller than ±1 μm. The document alleged that roughness over ±1 μm should deteriorate the properties of LEDs fabricated upon the GaN substrates. But the document mentioned nothing about grinding, lapping and polishing of GaN substrates. Japanese Patent Laying Open No. 10-256662 was indifferent to dislocation density on GaN substrates and paid no attention to the influences caused by the dislocation density upon the films grown thereon.

M, Ishida, M. Ogawa. K. Orita, O. Imafuji, M. Yuri, T. Sugino, K. Itoh, "Drastic reduction of threading dislocation in GaN regrown on grooved stripe structure", Journal of Crystal Growth 221(2000) p 345-349 pointed out a drawback of the ELO, which makes a $SiO_2$ (or SiN) ELO mask with many windows on a sapphire substrate and grows GaN films on the ELO-masked sapphire. The existence of the foreign material of the mask would induce cavities and non-uniform parts in the GaN film. For suppressing the cavities and the non-uniformity, Ishida et al. formed a plenty of 1 μm deep grooves by reactive ion-etching, which have a 7 μm wide bottom and 45 degree inclining (1-102) side walls and extend in parallel to <11-20> direction in the GaN film which had been grown along the c-axis. Then Ishida regrew a 2 μm thick GaN film of the grooved GaN film. The GaN film turned out to be of low dislocation density.

Ishida alleged that the c-axis growing speed and the <1-101> direction growing speed could be controlled by varying the group 5/3 mol rate of material gases (the ratio of ammonia/trimethylgallium). When the 5/3 ratio is 5500 times, the dislocations would converge at center lines on the surface of a 2 μm thick GaN and the dislocation density would substantially reduce. The group 5 gas is ammonia gas. The group 3 gas is trimethylgallium (TMG; $(CH_3)_3Ga$) in Ishida. Group 5/3 mol ratio means a quotient of mols of an $NH_3$ gas supply divided by mols of a TMG gas supply. That the group ratio 5/3 is 5500 means that 5500 mols of ammonia is supplied to every 1 mol of TMG. Supply of group 5 gas is extraordinarily large in comparison with group 3 gas (TMG). The excess large 5/3 rate was inherent to Ishida's new method. Ordinary MOCVDs take a 5/3 rate between 1000 and 3000. Ishida supplied far excess ammonia gas for controlling the on-bottom vertical growing speed and the on-slant slanting growing speed.

Ishida's report was difficult to understand. FIG. 6 shows a section of a groove prepared by Ishida in a growing GaN film. Ishida is explained on FIG. 6. Horizontal sides are C-planes (0001). A bottom of a groove is a C-plane (0001). The C-plane is a Ga-plane on which gallium atoms align overall. Two side slanting walls are (1-101) planes. The (1-101) planes are N-plane on which nitrogen atoms align overall. The slanting growing speed on (1-101) is denoted by "u". The vertical growing speed on (0001) is denoted by "v". The higher the 5/3 rate raised, the faster the <1-101> direction (on-N-plane) growth (u) was accelerated. The lower the 5/3 rate fell, the faster the <0001> (on-Ga-plane) direction was accelerated, Ishida alleged. An upper width of the groove is denoted by "M" (e.g., 7 μm). A depth of the groove is denoted by "F" (e.g., 1 μm). A depth of GaN recrystallization is denoted by "W" (e.g., 2 μm).

In FIG. 6, slanting growth (speed=u) starts from the slanting walls (point P) of the grooves and vertical regrowth (speed=v) starts from the flat sides of the groove at the same moment. If when the slanting (speed=u) growth from point P attains at point O, the vertical regrowth accidentally has a thickness W, dislocations on the groove would converge at middle point O. An assemble of dislocations at point O is count as one dislocation, because the dislocations are converges at the spot O. Thus dislocations seems to be reduced. Ishida's contrivance was complicated and difficult to accomplish. The condition is too rigorous. Since the regrowth height is W, the distance from the bottom to the regrowth surface is (F+W), where F is the groove depth. For simplicity, P is a middle of the slant. The distance from slant point P to the middle point O is $[\{W+(F/2)\}^2+\{(M/2)-(F/2)\cot\Theta\}^2]^{1/2}$. Here $\Theta$ is an angle of the slant to the horizontal plane. Crystal growth starting from P proceeds in the direction vertical to the slanting wall. A horizontal component of the distance OP is $(M/2)-(F/2)\cot\Theta$. A vertical component of the distance OP is $(F/2)+W$. The rate the horizontal distance to the vertical distance should be equal to $\tan\Theta$ for coinciding the regrowth attaining to point O with the slanting growth attaining to the same point O.

$$\tan\Theta=\{(M/2)-(F\cot\Theta/2)\}/\{(F/2)+W\}. \quad (1)$$

Here $\Theta=45$ degrees by Ishida. Thus Eq.(1) should be 1.

The vertical regrowth speed is v and the vertical regrowth height is W. When the thin film thickness attains to W, the slanting growth(speed=u) from P should reach point O. It takes time of $[\{W+(F/2)\}^2+\{(M/2)-(F/2)\cot\Theta\}^2]^{1/2}/u$ for the slanting $\$\$$ growth to progress from P to O. It takes time of W/v for the vertical regrowth (speed=v) to raise from the flat sides to the regrowth thickness. The speed rate u/v can be raised by enhancing the 5/3 rate. Namely u and v are controllable variables. If the speed rate u/v is given to satisfy the following relation, $$[\{(F/2)+W\}^2+\{(M/2)-(F\cot\Theta/2)\}^2]^{1/2}/W=u/v, \quad (2)$$

Dislocations on the groove would be gathered at point O by the regrowth.

If the materials are supplied at a rate at which u/v satisfies Eq. (2), recrystallization of a thickness W can assemble dislocations on the groove at middle point O just above the groove. An assembly of dislocations gathering at a point is counted as one dislocation. Thus Ishida can reduce dislocation density down to $1/100$ in the most fortunate case. Ishida alleged that when the group 5/3 rate was 5500, the ratio u/v satisfied Eq. (2) and dislocation density was reduced. In an example of Ishida, $F=1$ μm, $W=2$ μm, $M=7$ μm and $\Theta=45°$, Eq.(2) becomes, $$[\{(F/2)+W\}^2+\{(M/2)-(F\cot\Theta/2)\}^2]^{1/2}/W=2. \quad (3)$$

Thus supply of material gases at the group 5/3 gas rate determined by u/v=2 enables just 2 μm thick recrystallization to reduce dislocations. Ishida alleged that 2 μm of recrystallization on the grooves succeeded in reducing dislocation density in the example by gathering dislocations at point O, which is a cross point of the recrystallization level with a normal standing at a middle point of the bottom of the groove.

Ishida's prior art reference was an improvement of film growth for replacing the epitaxial lateral overgrowth (ELO). Ishida et al. aimed at producing not a thick GaN substrate but a GaN thin film of a 2 μm to 3 μm thickness. The present invention differs from Ishida in production of thick substrates or thin films and in objects. Ishida is now cited since the idea of reducing dislocations by grooves is intriguing.

However, Ishida's method is applicable only on rigorously restricted conditions of the predetermination of the groove depth F, the groove width M, the regrowth thickness W and the definite value of the u/v rate. If the recrystallization thickness is over the predetermined W or is under W, the dislocation density does not decrease, because dislocations diffuse out of the dislocation bundles again. All the grooves should take the predesigned values of depth F, width M and inclination $\Theta$. All the grooves should align in parallel to <11-20>.

Ishida said that the inclination $\Theta$ should be $\Theta=45$ degrees. A (1-102) plane crosses at 43.19 degrees to the C-plane (0001). Perhaps Ishida aimed at the slants of the grooves should coincide with (1-102) planes.

Ishida's proposal is an interesting method based upon the MOCVD. Ordinary MOCVDs supply group 3 (trimethylgallium etc.) and group 5 (ammonia) material gases at a group 5/3 rate of 1000 to 3000. But Ishida supplied the groups 3 and 5 material gases at a higher 5/3 rate=5500. Ishida's method increases the ammonia loss, which raises the cost of material gases. The inventors of the present invention think that the prevalent MOCVD methods are unsuitable, since carbon atoms contaminate the object nitride semiconductor substrates.

For the above reason, the inventors of the present invention produce GaN films by either a hydride vapor phase epitaxy (HVPE) method or a metallorganic chloride method (MOC) instead of the dominant MOCVD method. Both the HVPE and the MOC have an advantage of being immune from carbon contamination.

Instead of the Ga organic metals (trimethylgallium, triethylgallium), the HVPE employs a Ga metal melt in a Ga boat furnished at an upper region of a hot-wall type furnace as a Ga source. The Ga metal is heated by heaters and in converted into a Ga metal melt. The HVPE synthesizes once an intermediate compound of gallium chloride (GaCl) by blowing a mixture of hydrogen gas ($H_2$) and hydrochloride gas (HCl) to the molten Ga in the Ga boat. The HVPE further synthesizes gallium nitride (GaN) by blowing a mixture of hydrogen gas ($H_2$) and ammonia ($NH_3$) gas to a heated undersubstrate sustained on a susceptor and piles GaN crystal on the heated undersubstrate. The HVPE is immune from carbon contamination, since the materials contain no carbon.

The MOC method employs an organic metal (trimethylgallium, triethylgallium) as a Ga material. Unlike the MOCVD, the MOC once produces GaCl by a reaction of HCl with the organic metal at a first step. The MOC produces GaN by another reaction of GaCl with $NH_3$ at a second step and piles GaN on an undersubstrate installed at a lower region of a furnace. The undersubstrate has no chance of being in contact with the organic metal. Since GaCl is once produced, the MOC can suppress carbon contamination.

Japanese Patent Laying Open No. 2000-12900, "GaN single crystal substrate and method of same", which was proposed by the present inventions, disclosed a production method of a GaN substrate in vapor phase. The present invention employs an as-cut GaN substrate made by the method of Japanese Patent Laying Open No. 2000-12900 as a starting GaN substrate.

SUMMARY OF THE INVENTION

As-cut GaN substrate wafers for producing InGaN type blue LEDs have not been produced in vapor phase until recently. Techniques of grinding, lapping, polishing and etching have not been established for GaN wafers. Lapping (grinding) and polishing matter in the present invention. Lapping (grinding) and polishing suitable for GaN wafers are still unclear. Nobody knows to what degree of smoothness GaN wafers should be polished. There is no reliable guidelines for lapping (grinding) and polishing of GaN substrates.

In the description, "smoothness" is a word for representing a surface having little hills and little valleys. There is no parameter signifying the degree of smoothness, since smoothness cannot be measured directly. Roughness is an antonym of smoothness. Roughness signifies the degree of rugged surfaces having hills and valleys. There are a variety of parameters Rmax, Rms, Ra, Ry, Rz etc. signifying roughness of surfaces.

Rmax is a difference of heights between the highest protrusion (hill, mountain) and the lowest concavity (hole, valley) within a definite area on an object surface. Ra is an average of hill/valley height differences which is calculated by taking sampling points at a definite interval in two dimensions, measuring height differences h between neighboring sample points and averaging ($\Sigma h/N$) the height differences h. Rms is a root of an average of squares of height differences which is calculated by measuring height differences between neighboring hills and holes, squaring the height differences, averaging the squares and taking a root of the average ($\{\Sigma h^2/N\}^{1/2}$). Rmax, Ra, Rms . . . are all different for the same object surface. Relations among Rmax, Ra, Rms . . . are not simple. There is no definite relation among the roughness parameters Rmax, Ra, Rms . . . . Roughness parameter relations are contingent upon the roughness state of the object surface.

Rmax is the biggest among these parameters for the same surface. Ra is the smallest among Rmax, Ra and Rms. Rms takes an intermediate value between Ra and Rmax. The least value of a rate Rms/Ra is 1.3. If the object surface has random roughness, the rate Rms/Ra takes values from 1.3 to 2. It is a matter of course that Rmax is the largest from the standpoint of mathematics. Distortion will enlarge Rmax. Rmax is sensitive to irregular hill/valley. Rmax is not a suitable parameter for describing roughness of surfaces. Thus the present invention employs "Rms" as a parameter of describing roughness of surfaces.

A GaN substrate cannot be a substrate suitable for making light emitting diodes (LEDs) unless GaN, InGaN, AlGaN or other nitride layers of good quality are epitaxially grown on the GaN substrate. For the reason, it may be considered that highly smooth mirror surface would be required for GaN wafers. A smooth GaN mirror wafer, for example, of Rms2 nm would enable good InGaN layers or good GaN layers to grow epitaxially thereon.

But the assumption that a mirror wafer should be the best is not the fact. Unlike Si wafers which usually are free from dislocation, GaN substrates have high density of inherent dislocations, which depend upon the production methods. Dislocations of $10^7$ cm$^{-2}$ to $10^8$ cm$^{-2}$ accompany sophisticated GaN wafers which have been made by a HVPE method improved by the ELO and the facet-growth techniques. Morphology is a word for representing the quality of surfaces of films. A film having high smoothness is equivalent to a film with "good morphology". Bad morphology means that the object film surface has many scratches, scars, scribbles and other raggedness. Indeed, an Rms2 nm smooth GaN mirror wafer allows neat InGaN, GaN films with high smoothness to grow epitaxially thereon. A GaN mirror wafer is effective to make nitride films with high morphology.

A good morphology film, however, is not necessarily a good film. If it has high density of dislocations, the good morphology film is a bad film. Geometrical smoothness is one of desirable properties of the films. Low dislocation density is more important property of the films than the morphology. High density dislocations in the films lower emission efficiency and shorten lifetimes of light emitting devices (LEDs & LDs). Unfortunately films fall heir to all dislocations from the substrate. Epitaxy transcribes dislocations from the substrate to the films thereon. When a GaN film is epitaxially grown on a GaN substrate with $10^7$ cm$^{-2}$ to $10^8$ cm$^{-2}$ high dislocations, the GaN film becomes to have dislocations of a density of $10^7$ cm$^{-2}$ to $10^8$ cm$^{-2}$. The films are bad films despite good morphology.

What determines quality of epitaxially-grown films is not only geometrical morphology but also dislocation density. Low dislocation density is rather a factor more significant than good morphology. Here low dislocation density contradicts good morphology. Are low dislocation density and good morphology an alternative?

A geometrically highly smooth surface is suitable for growing superlattice or forming electrodes thereupon. When superlattices are made upon rugged surface of bad morphology, big thickness fluctuation disturbs the relation between injection current and luminosity.

If dislocation density is high, the epi-layer, which has geometrically good surface, is still plagued with an increment of non-emission centers and parasite levels and a decline of emission efficiency. The inventors have been aware that a decrement of dislocations is more effective than an enhancement of surface smoothness for heightening emission efficiency.

Dislocations are passed from a GaN substrate to an epi-layer. An initial dislocation density is equal to the dislocation density on the substrate. The best way would be to make and use low dislocation density nitride substrates. The preference to low dislocation density nitride substrates is not wrong. In fact, it is still difficult to produce low dislocation density nitride substrates at present. Extremely sophisticated contrivances can make nitride substrates with dislocation density less than usual ones. But the contrivances raise the cost of making nitride substrates further. Far expensive GaN substrates are yet unpractical. Even if on-GaN LEDs are superior to on-sapphire LEDs in some properties, the on-GaN LEDs which are built on expensive GaN substrates would not win the on-sapphire LEDs.

GaN substrates are far more expensive than sapphire substrates at present. What is the most important for GaN substrates is the cost reduction. Without significant cost alleviation, GaN substrates cannot equal the dominant, prevailing sapphire substrates in prices, demands, properties, utilities. Without new advantages which sapphire lacks, GaN substrates cannot replace prevalent sapphire substrates.

A first purpose of the present invention is to provide a nitride semiconductor substrate which enables device makers to make low dislocation density films epitaxially grown on the substrate.

A second purpose of the present invention is to provide a low cost nitride semiconductor substrate.

A third purpose of the present invention is to provide method of producing a nitride semiconductor substrate which enables device makers to make, low dislocation density films epitaxially grown on the substrate.

The nitride semiconductor substrate of the present invention has a surface which has been roughened by lapping (or grinding) to roughness between Rms5 nm and Rms200 nm. Rms5 nm to Rms200 nm mean rough surface. One purpose is to make a roughened surface. Polishing can be shortened or fully omitted. If polishing is omitted, the cost is alleviated to the great extent. Even if polishing is not fully omitted, time of polishing is reduced. GaN is rigid. Polishing of GaN is difficult. It takes much time and whetting granules to polish GaN substrates. Eliminating or shortening of polishing reduces cost of producing GaN substrate wafers. The surface roughness of Rms5 nm to Rms200 nm can be attained by grinding by fixed whetting granules. This is an advantage.

Polishing which utilizes free whetting granules takes much time and consumes expensive diamond, SiC, silica whetting granules. The preceding grinding (lapping) takes short time and dissipates no whetting granules. If nitride substrate wafers are finished only by grinding as-cut wafers without polishing, it brings about vast cost reduction of nitride substrate wafers.

In addition to the cost-reduction effect, the roughened substrate has a newly found effect of reducing dislocations in a film epitaxially grown on the substrate. The roughened substrate enables low dislocation density GaN, InGaN films to grow epitaxially on the substrate. This is an entirely novel effect, which will be later described in detail.

Semiconductor as-cut wafers (Si wafers and GaAs wafers) are processed into mirror wafers by lapping (or grinding) the as-cut wafers for regulating thickness, polishing surfaces for heightening smoothness, etching away process-induced degradation layers and washing the etched wafers. A series of the steps of processing is "as-cut wafer→lapping (grinding) →polishing→retching→washing→mirror wafer".

Both grinding and polishing eliminate superficial parts by scrubbing surfaces by whetting granules. Eliminating speed is high in grinding and low in polishing. The polishing process often contains two steps of a first polishing (gross polishing) and a second polishing (fine polishing).

A Grinding-apparatus includes a whetting turntable which is a metal disc having fixed diamond, SiC or silica whetting granules implanted thereon and a rotary disc plate.

A surface of a wafer is ground by fitting an object wafer on the rotary disc plate, bringing the surface of the wafer into contact with the whetting turntable, supplying a liquid on the turntable, revolving the turntable and rotating the disc plate on the turntable. This is the grinding utilizing fixed granules. The purpose of grinding is to reduce the thickness of wafers to a determined value and to prepare wafers with a definite thickness.

For regulating thickness of wafers, a lapping machine which has a lower turntable having fixed granules, an upper turntable having fixed granules, a sun gear at the center of the lower turntable, an internal gear rotatably mounted around the lower turntable. The lapping machine scrapes both surfaces of wafers at the same time by laying geared circular stencils having round holes on the lower turntable in engagement with the sun gear and the internal gear, putting wafers into the holes of the stencils on the lower turntable, pressing the wafers by the upper turntable, supplying a liquid, revolving the upper and lower turntables in reverse directions and rotating the internal gear or sun gear for giving planetary motions to the stencils. The fixed granules are implanted with a constant protrusion height into the metal surface of turntables. Granules are implanted onto the metal surface by resinbonding, vitrifiedbonding, metalbonding or electrobonding. 60% to 70% of diameters of the granules are embedded into metal turntables. The protrusion height is 30% to 40% of diameters of the granules. Lapping scrapes both surfaces at the same time. Grinding scrapes only one surface. The purpose of lapping and grinding is to regulate thickness of as-cut wafers into a definite thickness.

Use of large fixed granules accelerates grinding speed but roughens the surface. Use of small fixed granules reduces grinding speed but raises smoothness of a surface. Then object wafers are ground by a series of turntables of larger fixed granules to smaller fixed granules till the thickness reduces to a predetermined value.

Polishing follows grinding (or lapping). Differences between grinding (or lapping) and polishing should be clarified. Grinding aims at reducing thickness to a determined value. Polishing aims at making smooth surfaces. Polishing is done by free granules.

Instead of granule implanted turntable, polishing utilizes a flat turntable covered with a soft cloth. Object wafers are glued to a polishing disc plate. The plate is pushed down on the cloth of the turntable. A whetting liquid including free granules is supplied on the turntable. The turntable is revolved at a slow speed. The disc plate is rotated on the turntable. Another polishing machine scrapes both surfaces by laying down a window-carrying stencil on a lower turntable, putting wafers into the holes of the stencil, putting an upper turntable on the stencil, supplying the liquid, revolving the turntables in reverse directions and polishing both surfaces.

The object wafers are polished repeatedly by changing liquids from a larger granule liquid to a smaller granule liquid for long hours till the surface attains to the desired smoothness.

Such a series of polishing have been applied to Si wafers and GaAs wafers having matured technology as a matter of course since long before.

However, peripheral techniques are unmatured yet for GaN substrates because freestanding wide GaN substrate have not been made until recently. Furthermore GaN is far more rigid than Si or GaAs. Unfortunately GaN is more fragile than Si and GaAs. Rigidity and fragility prevent us from diverting the polishing technology of Si and GaAs to GaN wafers. GaN is rigid and difficult to polish. GaN (0001) has anisotropy. Ga-surface (0001) is very hard. Mechanical polishing utilizing diamond, SiC or aluminum whetting granules can scarcely polish the Ga-surface. N-surface (000-1) is less rigid than Ga-surface. Such anisotropy accompanies GaN.

In the case of GaN wafers, grinding process include several steps of grinding as-cut wafers by a gross turntable implanted with largest granules, replacing the gross turntable by a second turntable implanted with second largest granules, grinding the wafers by the second-gross turntable, finally grinding the wafers by a fine turntable implanted with smallest granules. An alternative lapping process is similar. Turntables are replaced from the largest granule implanted one to the smallest granule implanted one in turn.

Polishing follows grinding (or lapping). Polishing uses free small granules. Free granules are diffused into a liquid. The mixture of the liquid and the free granules is called a whetting liquid. The turntable has a soft plastic cloth on the surface. Wafers are stepwise polished by replacing the whetting liquid from the largest granule liquid to the finest granule liquid. Then mirror GaN wafers of less than Rms2 nm can be obtained. It takes quite much time for reaching the mirror wafers. Many GaN wafers are cracked or broken midway in the polishing process without reaching final mirror wafers. Since GaN is rigid but fragile, the rate of loss is large. Difficulty of polishing lowers yield and raises cost of mirror GaN wafers.

Grinding employs fixed granules. Grinding uses a swiftly revolving turntable implanted with the fixed granules and a quickly rotating disc plate. High rotation speeds give the grinding a high elimination (grinding) speed. About 5 μm/min (=300 μm/H) of grinding speed is obtained by preparing a resin-bonded turntable implanted with #1000 diamond, SiC or alumina whetting granules (average diameter of 5 μm) having projection heights of 1 μm to 2 μm, fitting a GaN wafer to a disc plate, pressing the GaN wafer to the turntable, revolving the turntable, turning the disc and grinding a GaN substrate. About 1 μm/min (=60 μm/H) of grinding speed is obtained by grinding a GaN wafer by another resin-bonded turntable implanted with #3000 diamond, SiC or alumina whetting granules (average diameter of 2 μm) having projection heights of 0.6 μm to 0.9 μm. Desirable average diameter of the fixed granules implanted on the final turntable is 2 μm to 5 μm. 5 μmφ granule implanted turntable enables the final grinding process to give Rms200 nm to the surfaces of GaN wafers. Over 5 μmφ granule implanted turntable gives roughness over Rms200 nm to the surfaces of GaN wafers. 2 μmφ granule implanted turntable enables the final grinding process to give Rms5 nm to the surfaces of GaN wafers. Under 5 μmφ granule implanted turntable gives roughness under Rms5 nm to the surfaces of GaN wafers. Sometimes use of 11 μmφ fixed granule turntable is allowable at the sacrifice of time and granules for avoiding break.

Turntables for polishing have no fixed granules. A soft plastic cloth is glued on the turntable. A whetting liquid which is a mixture of a liquid and granules is supplied on revolving turntable. Wafers are glued on polishing disc plate. The disc plate is pushed down on the cloth of the turntable. Supplying the whetting liquid, the polishing apparatus revolves the turntable and rotates the disc plate. Polishing of using a whetting liquid containing average 5 μmφ free granules of diamond, SiC or alumina achieves a slow polishing speed of 10 μm/hour. The polishing speed is about one thirtieth of the polishing based upon fixed granules of the same size. Polishing of using a whetting liquid containing average 2 μmφ free granules of diamond, SiC or alumina gives a very slow polishing speed of 3 μm/hour.

GaN wafers are polished step by step by changing whetting liquid from a larger granule liquid to a smaller granule liquid. It is possible to finish GaN surface to roughness less than Rms2 nm. But such high smoothness consumes long time and vast amount of diamond, SiC or alumina granules. Smoothness of under Rms1 nm requires average 0.1 μmφdiamond, SiC or alumina granules. Extra fine granules are difficult to produce and expensive. Such extra fine particles have a strong tendency of self-aggregation. 0.1 μm free granules often act as 0.5 μm to 1 μmφgranules. Free granules are flown out with liquid. Free granules are dissipated. Longtime polishing enhances polishing cost.

The present invention required mild smoothness Rms5 nm to Rms200 nm to GaN wafers. Rms5 nm to Rms200 nm means pretty gross surfaces. Such gross surfaces can be made only by grinding (or lapping) without polishing. The rough surface can dispense with polishing consuming expensive free granules and can be formed only by grinding (or lapping) for a short time without granule loss. The present invention can omit polishing based upon free granules. Fine diamond, SiC alumina granules are highly expensive. The present invention can curtail the granule-induced cost.

Rms100 nm to Rms200 nm of surface roughness can be obtained by a few minutes to a few tens of minutes of gliding based upon diamond, SiC, alumina granules implanted grinding turntable. Rms5 nm of surface roughness requires tens of minutes to several hours. The time depends upon grinding margins. Shallow grinding margins curtail processing time. Deep grinding margins require long time.

DETAILED DESCRIPTION OF THE PREFERRED EMBODIMENTS

Figure 1:
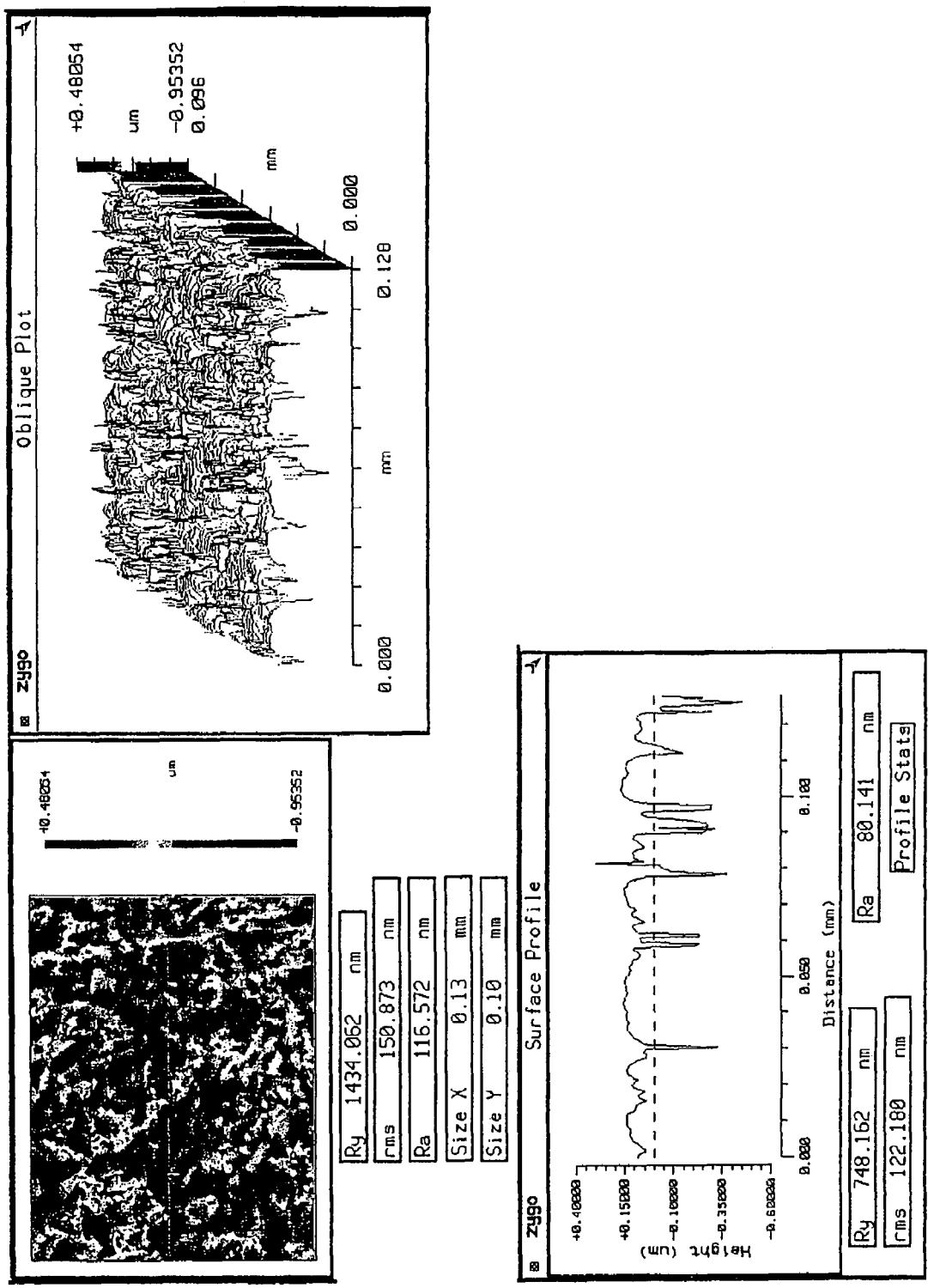
FIG. 1 is a microscope photograph of a part (0.13 mm×0.10 mm) of a GaN substrate having Rms150 nm and Ra116 nm of Embodiment 1, a two-dimensional height distribution diagram of the GaN surface and a one-dimensional height distribution graph scanning in x-direction of Embodiment 1. When a GaN film is epitaxially grown on the GaN substrate of Embodiment 1, the etch pit density on the GaN film is lower than $10^9$ cm$^{-2}$.

Embodiment 1 (Rms=150 nm, Ra=117 nm; FIG. 1)

FIG. 1 is a microscope photograph (upper left) of a GaN substrate of Embodiment 1, a two-dimensional height distribution diagram (upper right) of the GaN surface and a one-dimensional height distribution graph (lower left) scanning in x-direction of Embodiment 1. Embodiment 1 is a 2 inch(50 mm)φGaN wafer. But the microscope photograph shows a tiny rectangular part of 130 μm(x-direction)×100 μm(y-direction) of the GaN wafer.

Rms150.873 nm and Ra116.572 nm are not overall averages but local averages of Rms and Ra in the 130 μm×100 μm square. Ideally, Rms and Ra should be measured on the whole surface but full measurement takes much time. Then actual Ra, Rms measurements are restricted within the narrow region (130 μm×100 μm=0.13 mm×0.1 mm). The measured Rms value (150 nm) is included within the range (5 mm to 200 mm) determined by the present invention.

The GaN substrate of Embodiment 1 was produced by preparing a (111) GaAs single crystal undersubstrate, growing a thick GaN layer on the ELO method and the facet-maintaining method on the HVPE growth or the MOC growth, eliminating the GaAs undersubstrate by aqua regia, cutting the GaN crystal by a slicer into a plurality of GaN wafers. The details of the GaN growing method has been described in Japanese Patent Laying Open No. 2000-12900, "GaN single crystal substrate and method of producing same". Thus the description of the production method is omitted now.

In the left photograph of FIG. 1, there are many random hills and valleys, but heights of hills or depths of valleys are unclear. The upper right zigzag line figure of FIG. 1 clearly shows individual local distribution of heights and depths. High hills sharply project at several points. Deep valleys abruptly pierce downward at more plentiful points. Mountains and holes are mostly isolated. Little linear grooves are found. Scarce mountain ranges exist.

The rugged surface has been made by lapping (mechanical grinding). It may be assumed that the mechanical grinding would make many linearly continual scratches. But the fact is otherwise. Lapping makes many linear wounds in various directions by microscopic edges on the surface. Thus grooves are separated into individual isolated deep holes. Random direction cutting prevents continual grooves from surviving. The same reason denies making continual mountain ranges. Mountains and valleys are asymmetric. Mountains are rather akin to quasi-uniform. Valleys are deep and localized. The down left figure of FIG. 1 denotes a linear section cut along a line of y=constant. The dotted line is an average height line (h=0). Heights of mountains over the h=0 line are smaller. Depths of holes under the h=0 line are larger. Some of the holes have a depth of d=−0.35 μm.

The rectangular part of 0.13 mm×0.10 mm of the left upper photograph has roughness of Rms150 nm and Ra117 mm. The line part of a 0.13 mm length of the left down sectional graph has roughness Rms122 nm and Ra80 nm which are different from the roughness of the above rectangular part. Rms and Ra are probability variables. Individual values have little meaning. Averages of Rms, Ra within a definite scope obtain meanings. There are various Rms and Ra along horizontal lines cut at y=constant. Averages of all these values are Rms150 nm and Ra117 nm, which are roughness in the 0.13 mm×0.10 mm scope. It is a matter of course that some Rms and Ra in small partial regions deviate from the rectangle Rms and Ra.

The present invention defines the desired quality of GaN substrates by the roughness Rms and Ra counted upon the whole of the GaN substrates. Thus roughness should be measured on allover the substrate. But whole measurements of roughness take much time and cost. Thus Embodiment 1 is represented by the above 0.13 mm×0.10 mm rectangular part.

As mentioned before, the rate Rms/Ra takes various values larger than the minimum Rms/Ra=1.3. Embodiment 1 takes Rms/Ra=1.3 in the rectangular part and Rms/Ra=1.5 on the x-line of y=const.

Plenty of deep isolated holes prevail the lapped surface. The isolated holes are polygonal cones. Deep holes mean that the slanting walls of the holes are composed of low Miller index facets. Low Miller index facets form the polygonal slanting walls of the deep holes. The plane index of the surface is (0001), which means a C-plane. An epitaxially-grown film has also a surface whose normal is parallel to the c-axis. However parts having a C-plane occupy a far small rate on the surface. Almost all of the superficial parts are low Miller index facets of {1-101}, {11-21}, {10-12} or {1-212} and so on. The slanting walls of the holes are composed of the {1-101}, {11-21}, {10-12} and {1-212} facets.

Crystal growth proceeds in the direction parallel to the normal on facets. Dislocations extend with the crystal surface in the direction of the growth. Dislocations, which are continual threads extending in the growing crystal, turn toward to boundaries of neighboring facets building the slanting walls. There are six or twelve boundaries in a conical pit which is hexagonal or dodecagonal. Dislocations are gathered to the six or twelve boundaries. The dislocations, which are continual threads without vanishing, slide on the slanting boundaries and fall in bottoms of the reverse-conical holes. Fallen dislocations make a bundle of threading dislocations at the bottoms. Then the bundles of dislocations extend upward at the bottom in the progress of the crystal growth.

Figure 8:
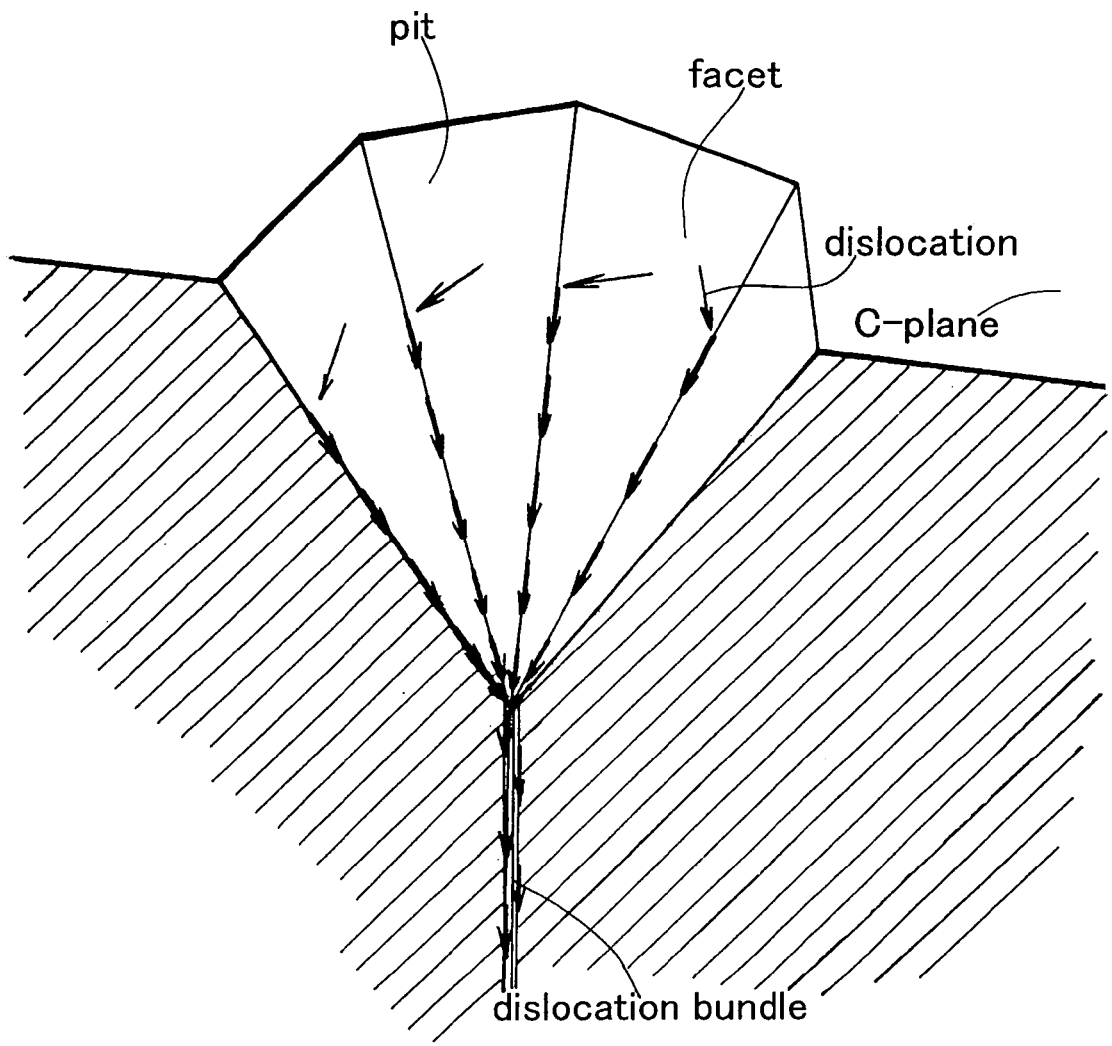
FIG. 8 is a perspective, sectional view of a cavity with facets, which is made by lapping (grinding) on a GaN substrate surface, for showing the principle of the present invention for reducing dislocations in extra regions by attracting dislocations to boundaries of facets of the cavity and concentrating the dislocations into the bottom of the cavity with the progress of oblique growth of the facets.

FIG. 8 shows the behavior of the dislocations in a hole prepared by the lapping process. The shown valley has six facets of low indexes, which is somewhat an idealized pit. The low index, which in particular signifies the low fourth index n of (hkmn), means a steep inclining wall. Thus the valleys are deep holes with steep walls. The steep walls gather forcibly dislocations into the bottom of the pit holes. The strong inclination facilitates the holes to arrest the dislocations at the bottom. The present invention relies upon such deep valleys having steep slanting walls. The inclination required by the present invention to the facets is far stronger than the localized ELO proposed by M, Ishida, M. Ogawa. K. Orita, O. Imafuji, M. Yuri, T. Sugino, K. Itoh, "Drastic reduction of threading dislocation in GaN regrown on grooved stripe structure", Journal of Crystal Growth 221(2000) p345-349. The strong pulling force of the steep inclination gathers dislocations into the bottoms of the holes in the present invention.

Figure 7:
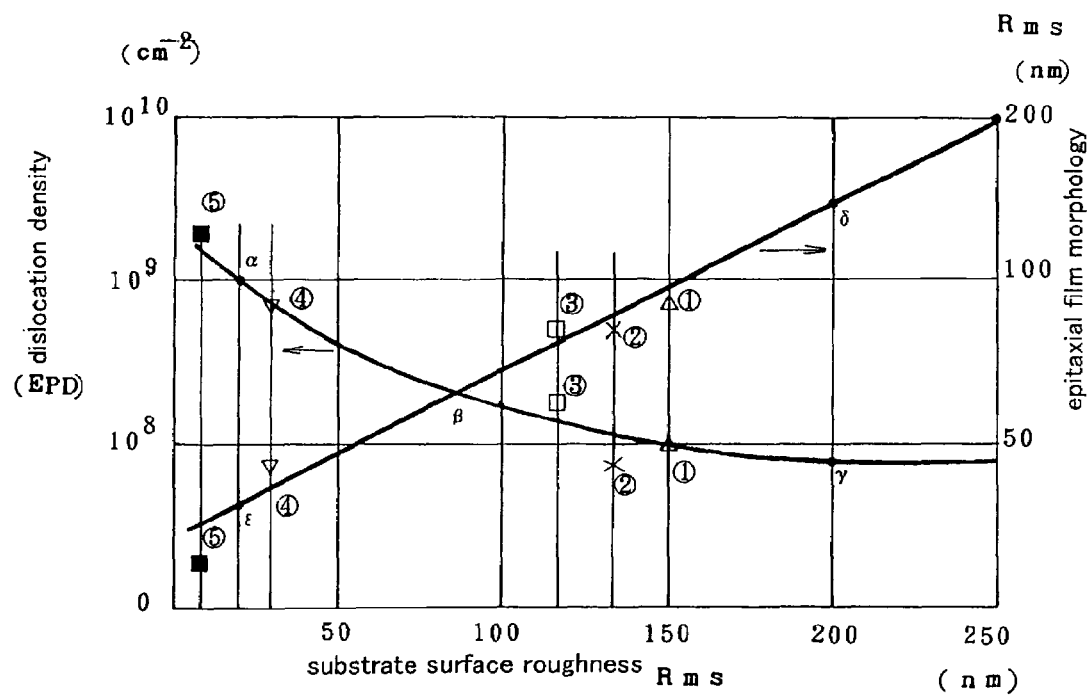
FIG. 7 is graphs showing relation of epitaxial film morphology and dislocation density with substrate surface roughness Rms in Embodiments 1 to 4 and Comparison example 5. Abscissa is the surface roughness (nm) of GaN substrates of Embodiments and Comparison Example. Left ordinate is etch pit density (cm$^{-2}$). Right ordinate is morphology of epitaxial film grown on the substrates of Embodiments and Comparison Example. A range between α and γ of the etch pit density (EPD) is the scope chosen by the present invention. A range between ε and δ shows the scope of surface roughness selected by the present invention.

Threading dislocations are gathered and are arrested by the bottoms of valleys. Dislocation density in other parts reduces, since dislocations have been swept away to the pit bottoms. Thus a film grown epitaxially on the rugged surface substrate has an advantage of low dislocation density. Namely the ruggedness of substrates reduces dislocation density of the film epitaxially grown thereupon. A common sense of crystal growth recommends a smooth, mirror flat substrate. This invention, which favors random-ground, rugged substrate, challenges the common sense. The GaN film grown epitaxially on the substrate of Embodiment 1 has roughness of Rms150 nm, which means not very good morphology of the film. Morphology allows by the present invention has a lower limit of Rms160 nm as shown at point δ of FIG. 7. The roughness Rms150 nm of Embodiment 1 satisfies the requirement of morphology Rms≦160 nm. The EPD (etch pit density) of the epitaxial film is EPD=$10^8$ cm$^{-2}$. The EPD is low enough, which satisfies the requirement. The upper limit of the EPD has been determined to EPDc=$10^9$ cm$^{-2}$ by the present invention.

The roles of holes for gathering dislocations have been described. What role the mountains on the substrate have? A mountain can be imagined by reversing FIG. 8 upside down. An analogy of the holes, dislocations existing on a mountain would go to boundaries of the mountain and dispersed to edges of the boundaries. Then dislocations laying on the mountains would disperse instead of gathering. Then the mountains are useless to reduce dislocations. On the contrary, the mountains (hills) cancel the function of the holes (valleys) and increase dislocation density by dispersing once gathered dislocations. Mountains have a malign influence for reducing substantially dislocations. If mountains and holes would be of equilibrium (mountain density is equal to hole density), the rugged surface would lose the power to reducing dislocations. Thus the present invention requires a plenty of individual separated valleys and few of individual separated mountains. FIG. 1 lower left figure of the x-direction scanning of surface roughness shows a smaller number of isolated mountains and a larger number of isolated holes.

Such an asymmetric mountain/hole distribution is effective to decreasing dislocations on the films epitaxially grown on the rough substrate.

Figure 2:
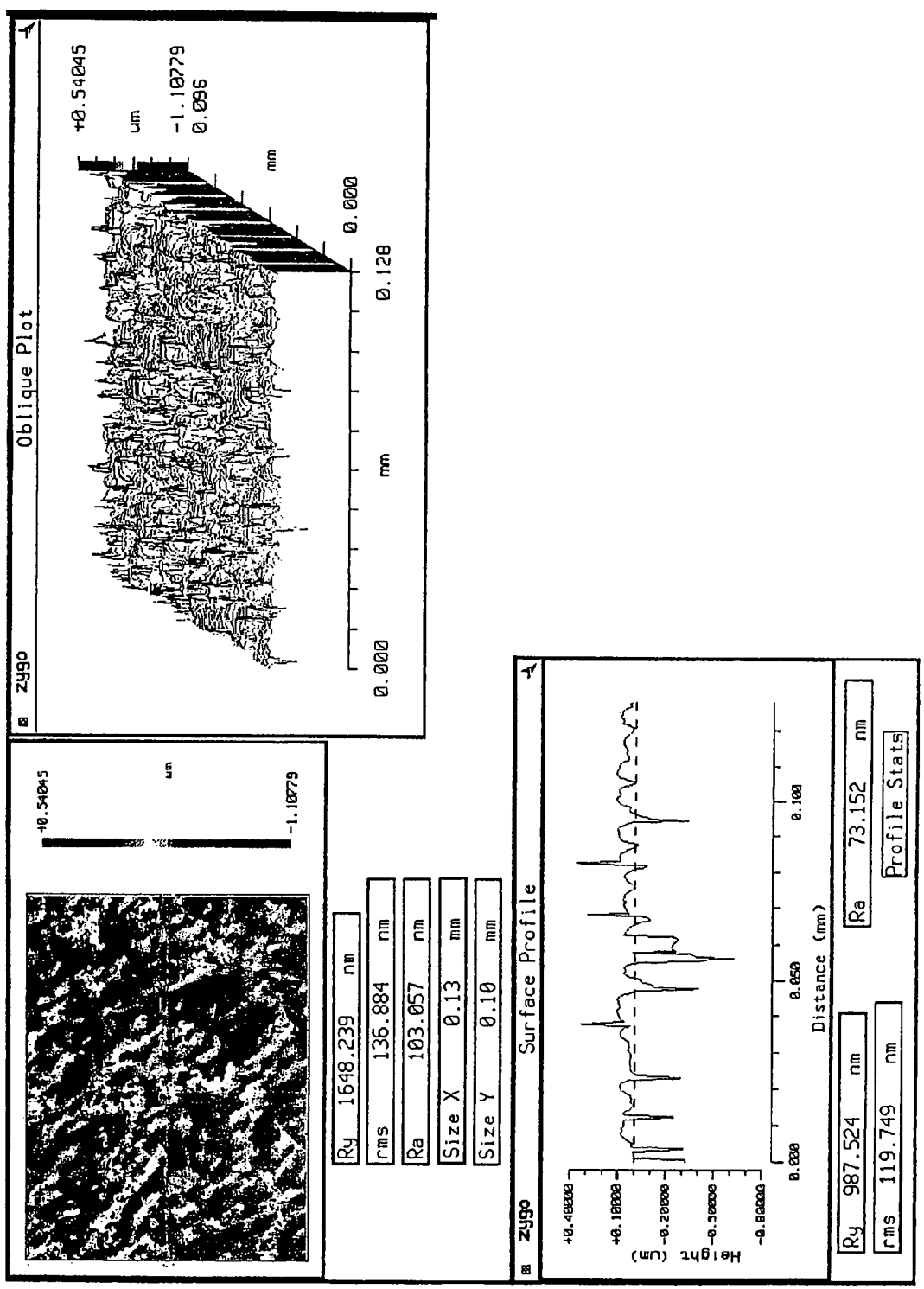
FIG. 2 is a microscope photograph of a part (0.13 mm×0.10 mm) of a GaN substrate having Rms137 nm and Ra103 nm of Embodiment 3, a two-dimensional height distribution diagram of the GaN surface and a one-dimensional height distribution graph scanning in x-direction of Embodiment 2. When a GaN film is epitaxially grown on the GaN substrate of Embodiment 2, the etch pit density on the GaN film is lower than $10^9$ cm$^{-2}$.

Embodiment 2 (Rms=137 nm, Ra=103 nm; FIG. 2)

FIG. 2 is a microscope photograph (upper left) of a GaN substrate of Embodiment 2, a two-dimensional height distribution diagram (upper right) of the GaN surface and a one-dimensional height distribution graph (lower left) scanning in x-direction of Embodiment 2. Embodiment 2 is a 2 inch(50 mm)φGaN wafer. The microscope photograph shows a tiny rectangular part of 130 μm(x-direction)×100 μm(y-direction) of the GaN wafer. The roughness of the rectangular part is Rms136.884 nm and Ra103.057 nm. The measured Rms value (137 nm) is included within the range (5 mm to 200 mm) determined by the present invention. Embodiment 2 takes Rms/Ra=1.3 in the rectangular part. Linear roughness measurement along x-direction of y=const shows Rms119.749 nm and Ra73.152 nm. The ratio of roughness parameters is Rms/Ra=1.6 on the x-line of y=const.

Method of producing the as-cut GaN wafer of Embodiment 2 is similar to Embodiment 1. The description of the production method is omitted. A thin GaN film has been grown on the rugged substrate of Embodiment 2. Morphology of the epitaxial film is not good. The EPD is low enough, of $0.9 \times 10^8$ $cm^{-2}$. As shown in FIG. 2 (two-dimension scanning and one-dimension scanning figures), the number of holes is large and the area of flat parts are narrow. The holes have big depths with big diameter. All dislocations within a hole are united into a single dislocation bundle. As the number of holes on the substrate increases, the number of EPD of the epi-film reduces. The result confirms the surmise of dislocations of the present invention shown in FIG. 8.

Figure 3:
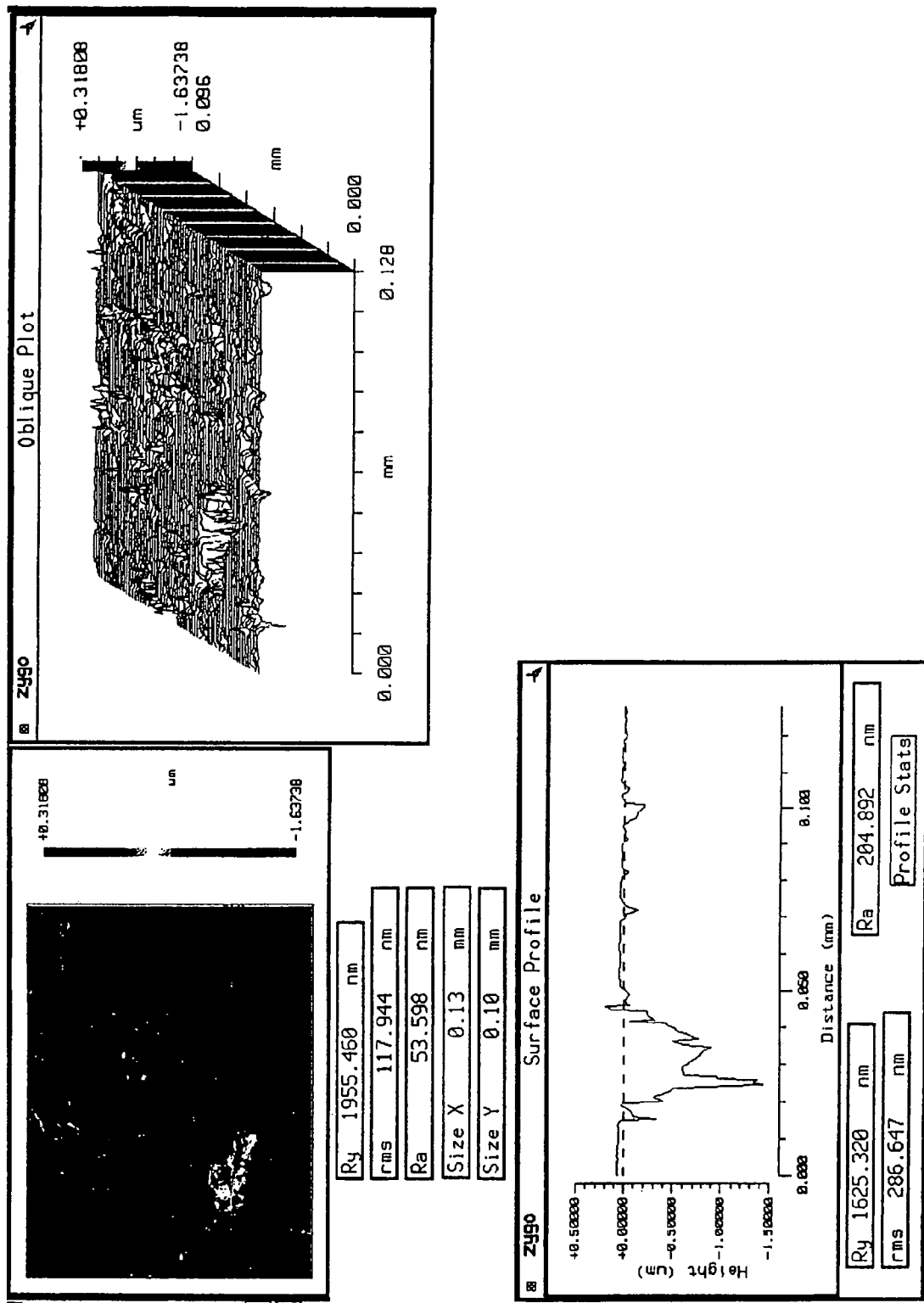
FIG. 3 is a microscope photograph of a part (0.13 mm×0.10 mm) of a GaN substrate having Rms118 nm and Ra54 nm of Embodiment 2, a two-dimensional height distribution diagram of the GaN surface and a one-dimensional height distribution graph scanning in x-direction of Embodiment 3. When a GaN film is epitaxially grown on the GaN substrate of Embodiment 3, the etch pit density on the GaN film is lower than $10^9$ cm$^{-1}$.

Embodiment 3 (Rms=118 nm, Ra=54 nm; FIG. 3)

FIG. 3 is a microscope photograph (upper left) of a GaN substrate of Embodiment 3, a two-dimensional height distribution diagram (upper right) of the GaN surface and a one-dimensional height distribution graph (lower left) scanning in x-direction of Embodiment 3. Embodiment 3 is a 2 inch(50 mm)φGaN wafer. The microscope photograph shows a small rectangular part of 130 μm(x-direction)×100 μm(y-direction) of the GaN wafer. The roughness of the rectangular part is Rms117.944 nm and Ra53.598 nm. The measured Rms value (137 nm) is included within the range (5 mm to 200 mm) determined by the present invention. Embodiment 3 takes Rms/Ra=2.2 in the rectangular part.

Linear roughness measurement along x-direction of y=const shows Rms286.647 nm and Ra204.892 nm. The roughness on the x-line is bigger (about twice) than the roughness Rms and Ra on the above rectangle region. This is because the x-line includes extraordinary deep holes which appears at a left nearer region in the right 2-dimensional figure of FIG. 3 by chance. The ratio of roughness parameters is Rms/Ra=1.4 on the x-line of y=const.

GaN film has been grown on the rugged substrate of Embodiment 3. Morphology of the epitaxial film is improved. The EPD, however, increases to $1.5 \times 10^8$ $cm^{-2}$. As shown in FIG. 3 (two-dimension scanning and one-dimension scanning figures), the number of holes is reduced and the area of flat parts is raised. Since the number of holes is decreased, the surface loses a part of the power of gathering dislocations and reducing dislocation density. Then the EPD increases.

Figure 4:
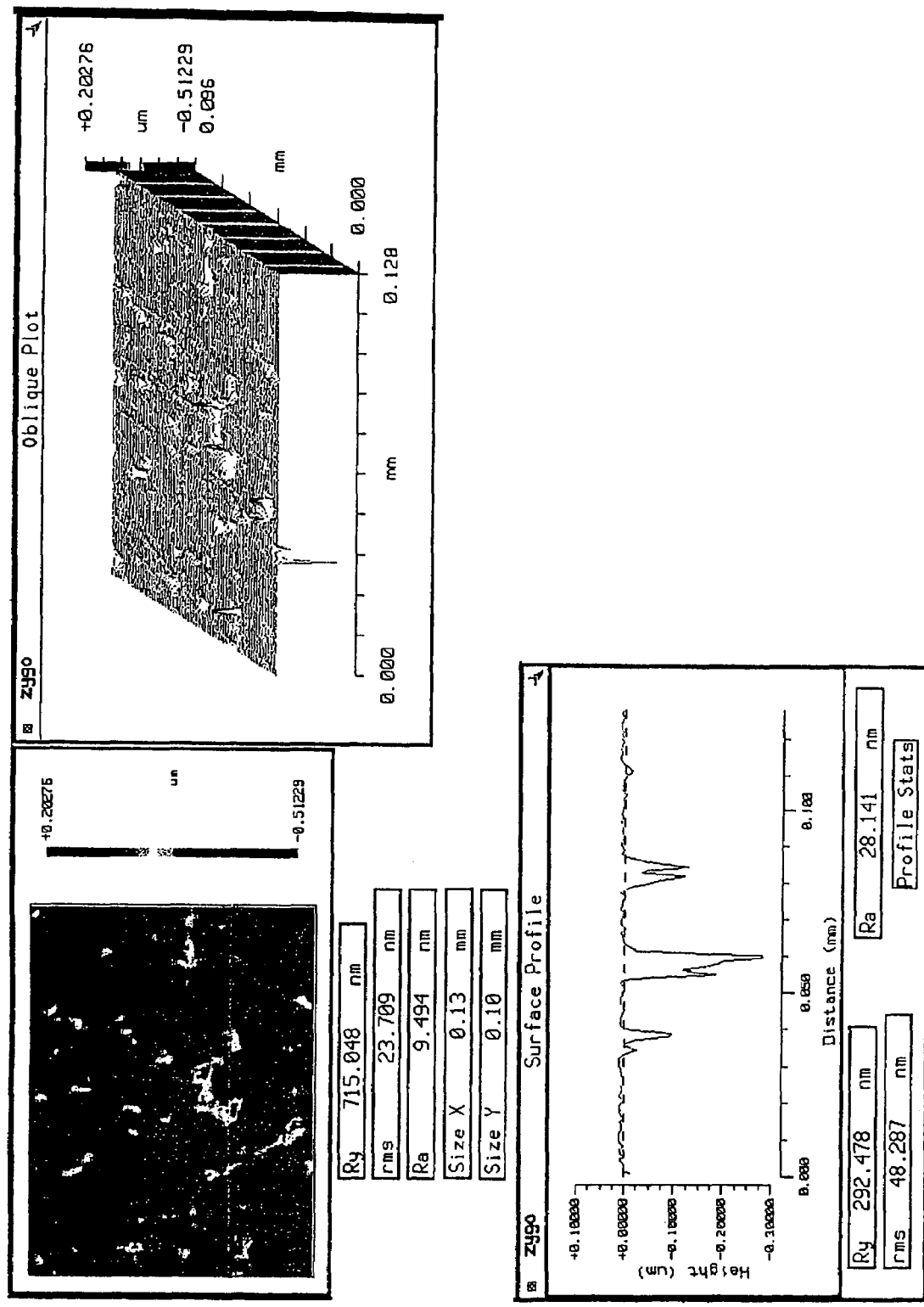
FIG. 4 is a microscope photograph of a part (0.13 mm×0.10 mm) of a GaN substrate having Rms23 nm and Ra9 nm of Embodiment 4, a two-dimensional height distribution diagram of the GaN surface and a one-dimensional height distribution graph scanning in x-direction of Embodiment 4. When a GaN film is epitaxially grown on the GaN substrate of Embodiment 4, the etch pit density on the GaN film is lower than $10^9$ cm$^{-2}$.

Embodiment 4 (Rms=24 nm, Ra=9 nm; FIG. 4)

FIG. 4 is a microscope photograph (upper left) of a GaN substrate of Embodiment 4, a two-dimensional height distribution diagram (upper right) of the GaN surface and a one-dimensional height distribution graph (lower left) scanning in x-direction of Embodiment 4. Embodiment 4 is a 2 inch(50 mm)φGaN wafer. The microscope photograph shows a small rectangular part of 130 μm(x-direction)×100 μm(y-direction) of the GaN wafer. The roughness of the rectangular part is Rms23.709 nm and Ra9.494 nm. The measured Rms value (24 nm) is included within the range (5 mm to 200 mm) determined by the present invention. Embodiment 4 takes Rms/Ra=2.4 in the rectangular part.

Linear roughness measurement along x-direction of y=const shows Rms48.287 nm and Ra28.141 nm. The roughness on the x-line is bigger (about twice to three times) than the roughness Rms and Ra on the above rectangle region. This is because the x-line includes very extraordinary deep holes (−1.4~−1 μm depth), which appears at a middle lower region in the right 2-dimensional figure of FIG. 4, by chance. The number of holes deceases. The depth of holes is decreases. The ratio of roughness parameters is Rms/Ra=1.7 on the x-line of y=const.

GaN film has been grown on the rugged substrate of Embodiment 4. Morphology of the epitaxial film is further improved. The EPD, however, still increases to $8 \times 10^8$ $cm^{-2}$. As shown in FIG. 4 (two-dimension scanning and one-dimension scanning figures), the number of holes is reduced and the area of flat parts is raised. Since the number of holes is further decreased, the surface loses a part of the power of gathering dislocations and reducing dislocation density. Then the EPD increases.

Figure 5:
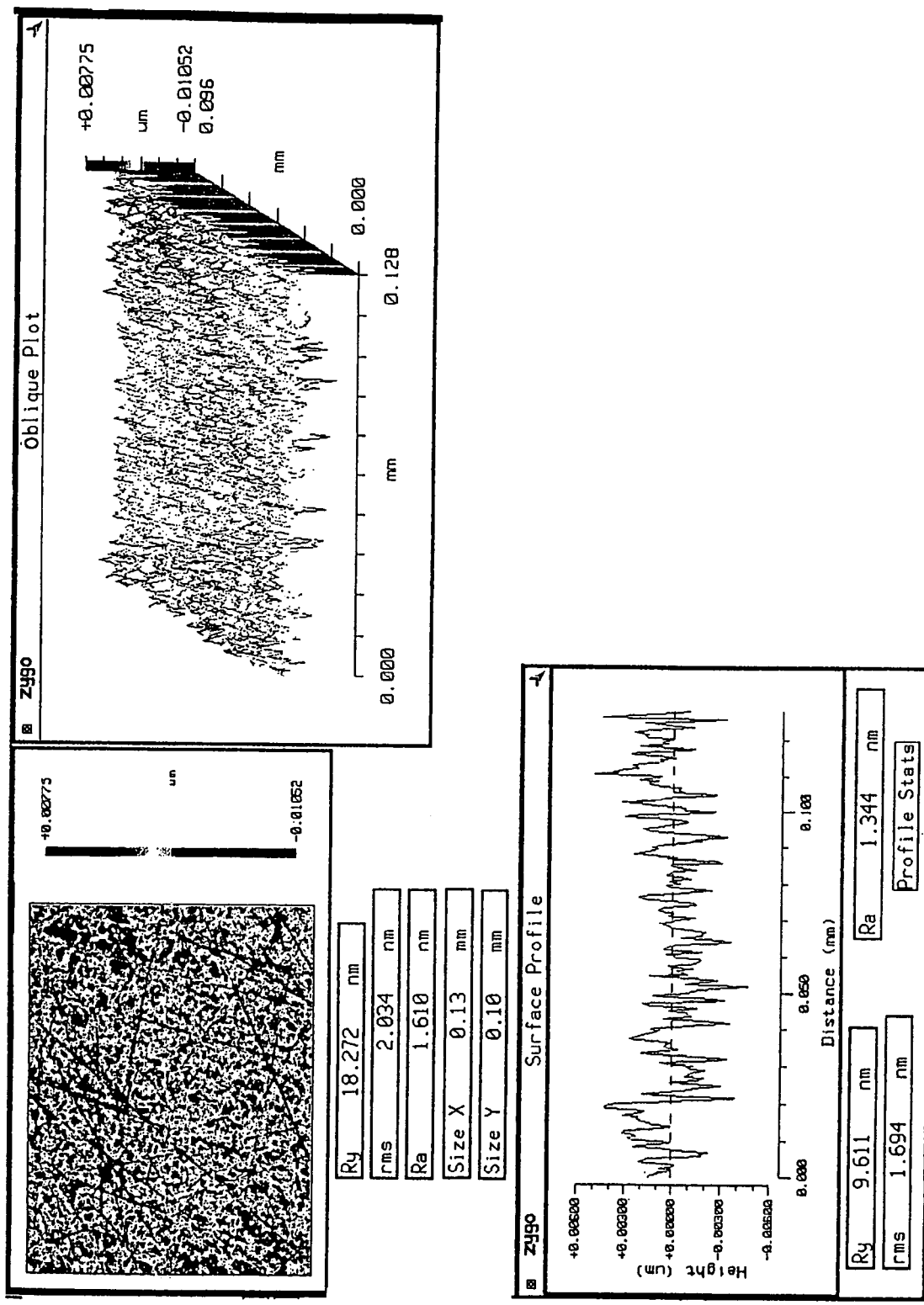
FIG. 5 is a microscope photograph of a part (0.13 mm×0.10 mm) of a GaN substrate having Rms2 nm and Ra1.6 nm of Comparison Example 5, a two-dimensional height distribution diagram of the GaN surface and a one-dimensional height distribution graph scanning in x-direction of Comparison Example 5. When a GaN film is epitaxially grown on the GaN substrate of Comparison Example 5, the etch pit density on the GaN film is higher than $10^9$ cm$^{-2}$.
Figure 6:
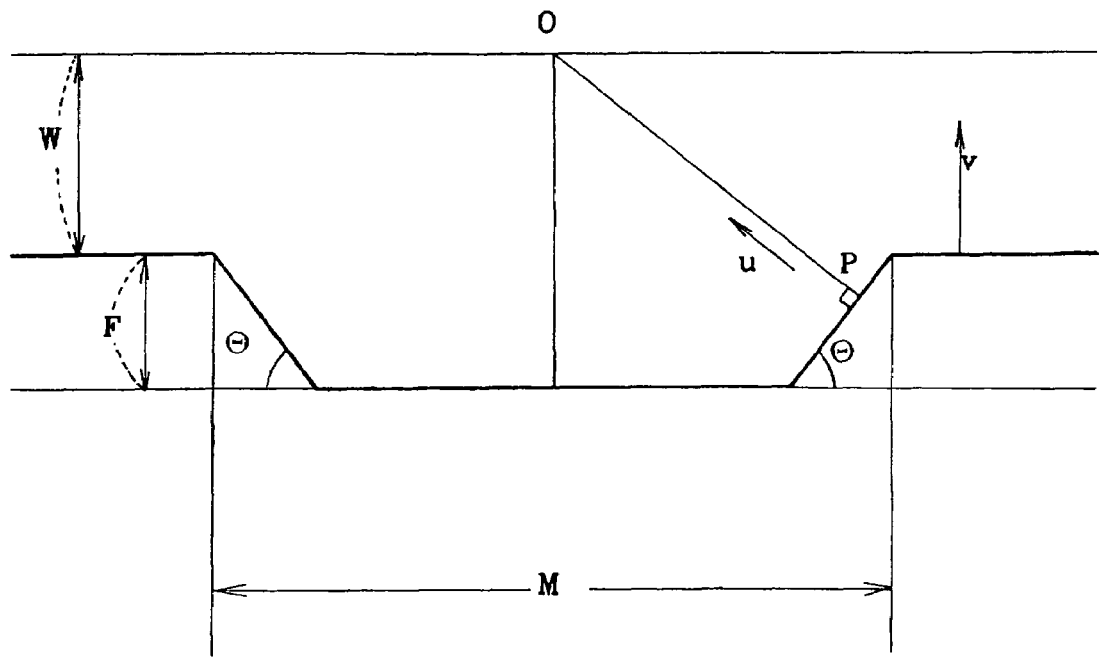
FIG. 6 is a schematic view of a groove of a proposal of digging parallel grooves in stead of ELO masks on a GaN crystal, maintaining a group 5/3 rate at 5500 times, equalizing the growth on flat bottoms to the growth on slanting slops at the recrystallization planes, gathering dislocations to middles of the grooves and lowering dislocation density on the GaN crystal, which was proposed by M, Ishida, M. Ogawa. K. Orita, O. Imafuji, M. Yuri, T. Sugino, K. Itoh, "Drastic reduction of threading dislocation in GaN regrown on grooved stripe structure", Journal of Crystal Growth 221(2000) p 345-349.

Comparison Example 5 (Rms=2 nm, Ra=1.6 nm; FIG. 5)

FIG. 5 is a microscope photograph (upper left) of a GaN substrate of Comparison Example 5, a two-dimensional height distribution diagram (upper right) of the GaN surface and a one-dimensional height distribution graph (lower left) scanning in x-direction of Comparison Example 5. Attention should be paid that the height scales are different from the preceding embodiments. The height scales are very small in FIG. 5 for clarifying small roughness. Comparison Example 5 is a 2 inch(50 mm)φGaN wafer. The microscope photograph shows a small rectangular part of 130 μm(x-direction)×100 μm(y-direction) of the GaN wafer. The roughness of the rectangular part is Rms2.034 nm and Ra1.610 nm. The measured Rms value (2 nm) is excluded out of the range (5 μm to 200 μm) determined by the present invention. Comparison Example takes Rms/Ra=1.3 in the rectangular part. Linear roughness measurement along x-direction of y=const shows Rms1.694 nm and Ra1.344 nm. The number of holes deceases. The depth of holes is decreased. Neighboring holes are unified. The ratio of roughness parameters is Rms/Ra=1.3 on the x-line of y=const.

GaN film has been grown on the smooth substrate of Comparison Example 5. Morphology of the epitaxial film is still further improved. The morphology is the best among five examples. The EPD, however, still increases to $2\times10^9$ cm$^{-2}$. The present invention requires the EPD below $1\times10^9$ cm$^{-2}$. The measured EPD is excluded out of the range. As shown in FIG. 5 (two-dimension scanning and one-dimension scanning figures), the number and depth of holes are further reduced and the area of flat parts is enhanced. Comparison Example 5 has poor power of gathering dislocations and reducing dislocation density. Then the EPD jumps over the predetermined limit ($1\times10^9$ cm$^{-2}$).

When a substrate has small values of roughness Rms, Ra, an epitaxially-grown film has large EPDs. The smooth surface has a poor function of reduction of EPDs. The epi-film succeeds the EPD of the substrate. The EPD decreases little. When a substrate has large roughness Rms or Ra, an epitaxial layer grown on the rough substrate has small EPDs, because deep holes on the roughness surface reduce dislocations on the epi-layer. The larger the roughness of the substrate is, the lower the dislocation density (EPD) of the epi-layer is. That a good substrate is a smooth substrate is a common sense of crystal growth. But the belief is wrong. Changes from FIG. 1 to FIG. 5 are a tendency of vanishing of valleys, flattening of mountains, unification of holes and smoothing of surfaces and, which means vanishing of valleys and mountains, and accompanying tendency of increasing of EPDs on epi-layers.

The present invention discovers that the morphology of the film epitaxially-grown on a nitride semiconductor substrate contradicts the dislocation density of the nitride semiconductor (e.g., GaN) substrate. The nitride semiconductor substrate should have large roughness between Rms5 nm and Rms200 nm for satisfying the contradictory requirements. Larger roughness between Rms200 nm to Rms100 nm of the substrate with affluent valleys accelerates reduction of dislocations on the epitaxial film. Smaller roughness between Rms5 nm to Rms100 nm effectively improves morphology of the epitaxial film. Compatibility of morphology and dislocations requires the substrate roughness of Rms5 nm to Rms 200 nm. The present invention expresses the roughness by Rms, which is a root mean square of deviation ($\{<\Sigma(x-m)^2/N>\}^{1/2}$). The present invention can be otherwise expressed by other roughness parameters. There are a variety of roughness parameters of Rmax, Ra, Rms, Ry, Rz and ±μm. Definitions of the parameters are different. Relations among these roughness parameters are not uniquely determined. Here Rms is an average on the whole surface of an object GaN substrate.

We claim:

1. A method of producing a nitride semiconductor substrate comprising the steps of forming a nitride semiconductor film on a GaAs undersubstrate by an HVPE method or an MOC method, eliminating the GaAs undersubstrate into a freestanding nitride semiconductor wafer, and lapping a surface of the freestanding nitride semiconductor wafer by fixed whetting granules into surface roughness between Rms 100 nm and Rms 200 nm, the surface having a larger number of individual separated valleys and a smaller number of individual separated mountains.

2. The method according to claim 1, wherein the fixed whetting granules have average diameters between 2 μm and 5 μm.

* * * * *